United States Patent [19]
Lal et al.

[11] Patent Number: 5,744,253
[45] Date of Patent: Apr. 28, 1998

[54] THIN-FILM RECORDING MEDIUM WITH THIN CHROMIUM UNDERLAYER

[75] Inventors: Brij Bihari Lal, San Jose; Tadashi Shinohara, Fremont, both of Calif.

[73] Assignee: HMT Technology Corporation, Fremont, Calif.

[21] Appl. No.: 964,745

[22] Filed: Oct. 22, 1992

[51] Int. Cl.$^6$ ................................................ G11B 23/00
[52] U.S. Cl. .................... 428/611; 428/928; 428/667; 428/666
[58] Field of Search ...................... 428/611, 928, 428/666, 667

[56] References Cited

U.S. PATENT DOCUMENTS 5,023,148  6/1991  Fisher et al. ............................ 428/667
5,024,903  6/1991  Mizukami ............................... 428/668
5,057,200  10/1991  Lal et al. .............................. 204/192.2
5,084,152  1/1992  Lin ..................................... 204/192.15

*Primary Examiner*—Valerie Lund
*Attorney, Agent, or Firm*—Peter J. Dehlinger; Judy M. Mohr

[57] ABSTRACT

A magnetic thin-film medium characterized by high coercivity, loop squareness, and signal-to-noise ratio characteristics. The medium includes a disc-like substrate, a sputtered Cr underlayer having a thickness between 100–300 Å, and a sputtered Co alloy magnetic thin-film layer having a thickness between 250–800 Å. The sputtered Cr and magnetic layers are preferably formed under sputtering conditions in which a negative bias of between −50 to −600 volts is applied to the substrate.

4 Claims, 5 Drawing Sheets

THIN-FILM RECORDING MEDIUM WITH THIN CHROMIUM UNDERLAYER

1. FIELD OF THE INVENTION

The present invention relates to a thin-film magnetic recording medium and to a method of producing the same.

2. REFERENCES

Fisher, R. D., et al., IEEE Trans. on Magn, 22:352 (1986).
Howard, J. K., J Vac Sci Technol, A4(1):1 (1986).
Hughes, G. F., J Appl Phys, 54:5306 (1983).
Johnson, K. E., et al., J. Appl Phys, 67:4686 (1990).
Johnson, K. E., et al., IEEE Trans. on Magn, 28(5):3100 (1992).
Kitaka, M., et al., J Appl Phys, 54(12):7089 (1983).
Lal, B. B., et al., IEEE Trans. on Magn, 27(6):4739 (1991).
Miura, S., et al., IEEE Trans. on Magn, 24(6):2718 (1988).
Sanders, I. L., et al., IEEE Trans. on Magn, 25(5):3869 (1989).
Shiroishi, Y., et al., IEEE Trans. on Magn, 24:2730 (1988).
Yogi, T., et al., IEEE Trans. on Magn, 24(6):2727 (1988).

3. BACKGROUND OF THE INVENTION

Thin-film hard disc magnetic media are widely used in read/write memory devices in computers. Increasingly, there is an effort in the thin-film medium industry to achieve higher recording density (Howard). Among the magnetic properties which are important to a high recording density are:

(1) Coercivity, defined as the magnetic field required to reduce the remanence magnetic flux to 0, i.e., the field required to erase a stored bit of information. Higher coercivity in a medium allows adjacent recorded bits to be placed more closely together without mutual cancellation. Thus, higher coercivity is associated with higher information storage density.

(2) Magnetic remanence $M_r$, which is a measure of the signal amplitude which can be read from an isolated pulse stored in the medium—the greater the remanence, or moment, the greater the signal amplitude which can be detected in a reading operation. A related property is orientation ratio, which measures $M_r$(circumferential)/$M_r$(radial). A high orientation ratio indicates a favorable crystal orientation in the circumferential direction of signal recording, and leads to a higher signal output.

(3) Loop squareness ratio S, or $M_r/M_s$ where $M_s$ is the saturation magnetic field. Loop squareness ratio provides a measure of the switching field distribution of the magnetic particles in the medium. A loop squareness ratio of 0.75–1 is desired for high-density recording.

(4) Signal-to-noise ratio (SNR) which defines the ratio of signal amplitude, or peak-to-peak amplitude of a single pulse, as a function of recording frequency, to recording noise at that frequency. High SNR ratios, due both to good signal amplitude and low noise, are necessary for high density recording.

The most widely used commercial thin-film media (discs) are prepared by sputtering a magnetic thin film on a substrate, such as a textured, plated aluminum substrate. The disc is typically prepared by sputtering an underlayer, such as a chromium underlayer, onto the substrate surface, then sputtering a cobalt-chromium based or cobalt-nickel based magnetic thin film over the underlayer (e.g., Kitaka; Miura; Sanders; Shiroishi; and U.S. Pat. Nos. 4,888,514, 4,833,044, 4,816,127, and 4,735,840). A protective, lubricating carbon overcoat may be applied over the thin-film layer by sputtering.

Studies on the effect of Cr underlayer thickness and magnetic-film thickness on media characteristics indicate that a Cr-underlayer thickness of greater than about 800 Å, and a magnetic thin-film layer between about 200–800 Å are required for achieving a combination of high coercivity, good loop squareness and high SNR.

A number of studies, for example, have shown that coercivity increases significantly as Cr underlayer thickness is increased between about 150 Å to 2,000 Å (Lal; Fisher; Johnson, 1990; Yogi).

Studies on the effect of Cr-underlayer thickness on media with very thin magnetic films (85 Å) indicate that media noise peaks at an underlayer thickness of about 250 Å, but drops off significantly for very thin Cr layers (25–75 Å) and for relatively thick (600–1,200 Å) Cr underlayers (Johnson, 1992). The low noise observed for ultrathin underlayers may be due to elemental segregation, which gives rise to decreased grain interactions. With increased Cr underlayer thickness, above about 600–800 Å, preferred columnar growth may account for greater grain segregation and reduced noise. Thus, at a Cr underlayer thickness of 800 Å or more, a disc having both high coercivity and low noise properties can be achieved.

In addition, commercial discs intended for high density recording may contain 3–20 atom percent Pt in the Co/Cr-based magnetic thin film, for achieving enhanced coercivity properties. A significant part of the cost of such discs is the cost of the sputtered chromium underlayer, and the cost of Pt-containing magnetic alloys used as targets for producing the magnetic thin film layer.

4. SUMMARY OF THE INVENTION

It is one general object of the invention to provide a thin film medium having high coercivity, orientation ratio, $M_r t$, and SNR properties.

A related object of the invention is to achieve the density recording properties at reduced material cost.

It is another object of the invention to provide a sputtering method for producing such a medium.

In one aspect, the invention includes a magnetic thin-film medium (or disc) which comprises a disc-like substrate, a sputtered Cr underlayer having a thickness between about 100–300 Å, and a sputtered magnetic thin-film layer formed from a Co alloy, and having a thickness between about 250–800 Å. The medium is preferably characterized by:

(i) a coercivity greater than about 1200 Oe, preferably greater than 1,400 Oe;

(ii) a loop squareness ratio of greater than about 0.75, preferably greater than 0.8;

(iii) an orientation ratio, or $M_r$(circumferential)/$M_r$(radial), of greater than 1.4; and (iv) a SNR ratio comparable to that of a disc having a relatively thick (>500 Å) Cr underlayer.

In a preferred embodiment, the magnetic thin-film layer is formed of a Co/Cr/Ta alloy composition, preferably containing 80–90 atom percent Co, 5–20 atom percent Cr, and 2–10 atom percent Ta, the Cr underlayer has a thickness between about 150–250 Å, and the magnetic thin-film layer has a thickness between about 400–800 Å.

In another aspect, the invention includes an improved method for preparing a thin-film medium in which a Cr underlayer and a magnetic thin-film layer are successively sputtered ont a substrate. The improvement includes sputtering the Cr underlayer to a final thickness of between 100–300 Å, preferably by DC magnetron sputtering, at a substrate bias between about −50 to −600 volts. The media so formed has coercivity and dynamic recording properties comparable to those in which the Cr underlayer has a thickness greater than 800 Å, and a higher loop squareness ratio and orientation ratio.

In a related aspect, the invention includes a method of producing a thin-film magnetic medium having high coercivity, loop squareness, and signal-to-noise ratio characteristics. The method includes the steps of sputtering onto a disc-like substrate, a Cr underlayer, to a final underlayer thickness of between 100–300 Å, and at a substrate bias of between about −50 to −600 volts, and sputtering onto the Cr underlayer, a thin-film magnetic layer formed of a Co/Cr alloy, to a final layer thickness between about 250–800 Å.

These and other objects and features of the invention will be more fully appreciated when the following detailed description of the invention is read in conjunction with the accompanying drawings.

Figure 4A:
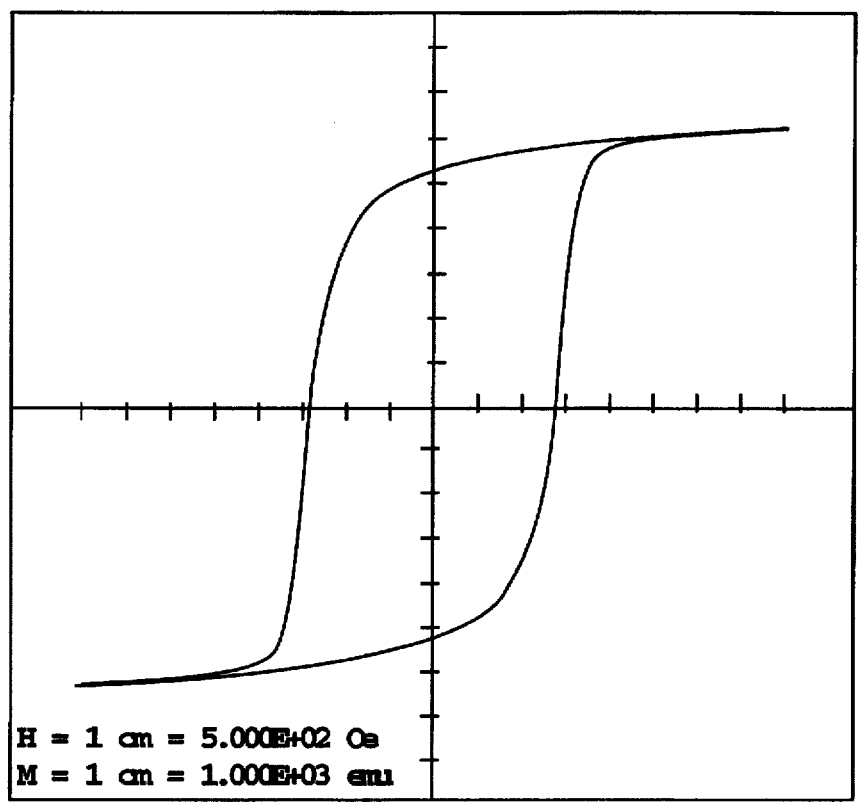
Figure 4B:
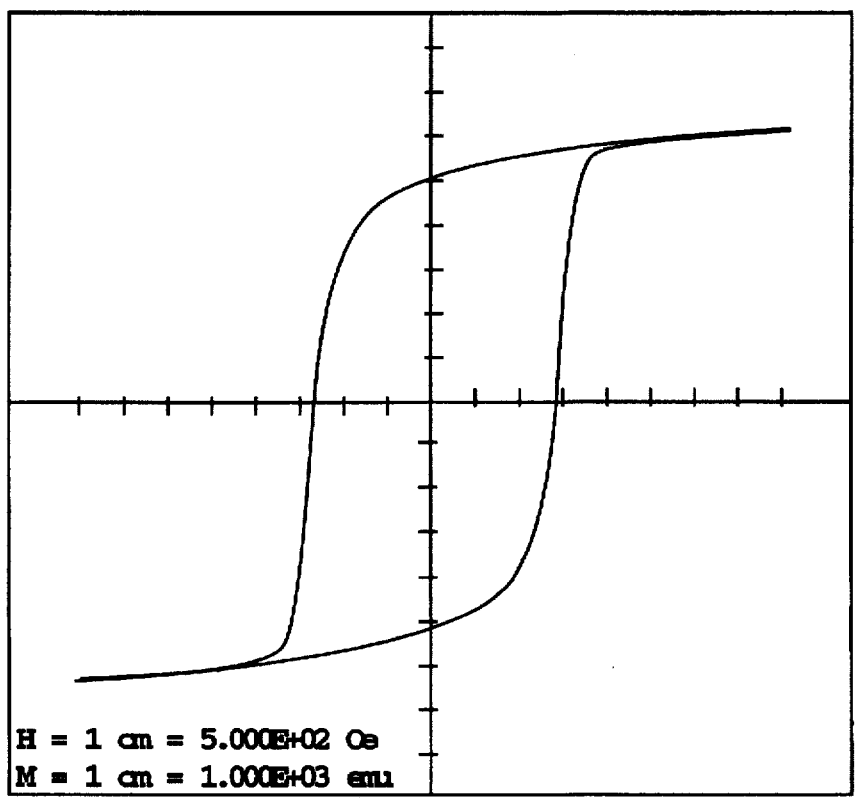
Figure 5A:
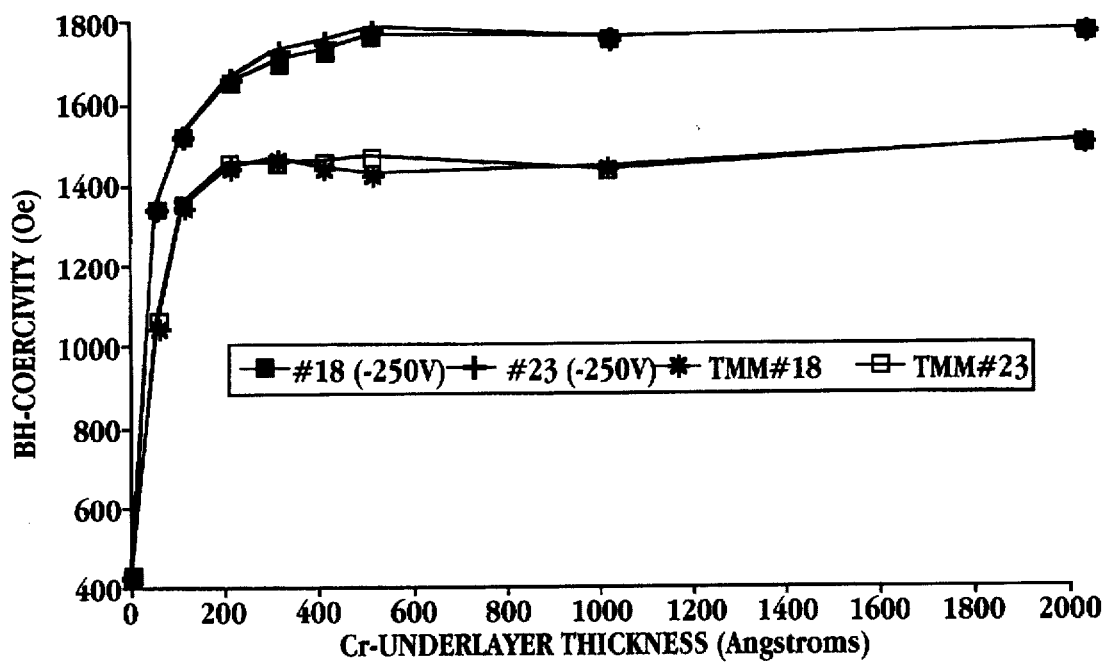
Figure 5B:
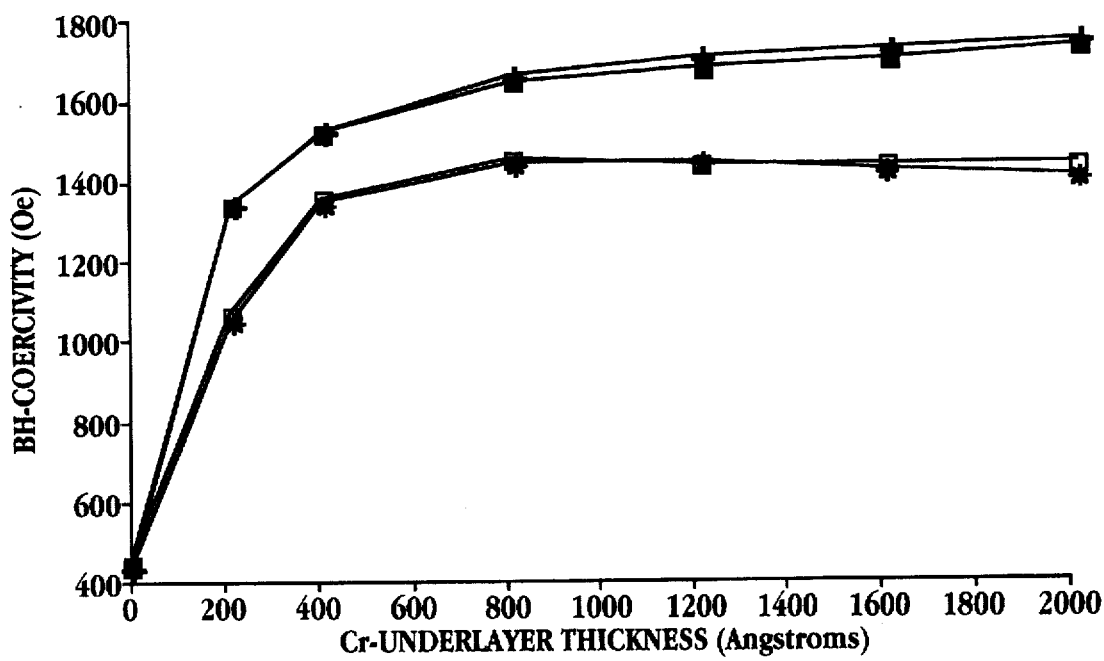
Figure 6:
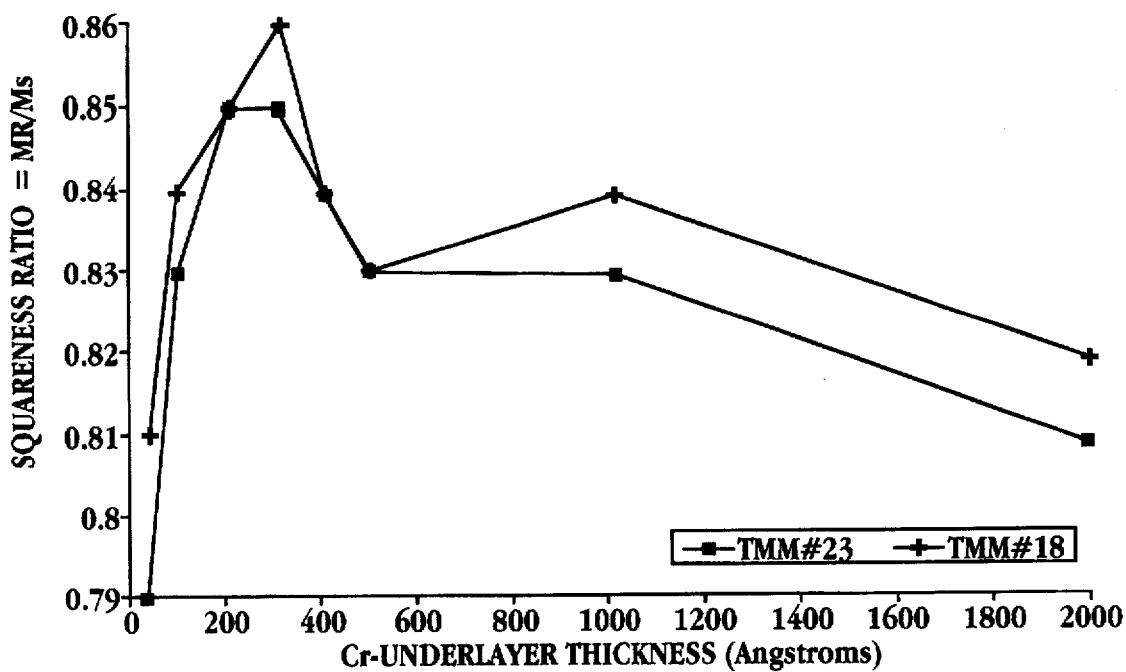
Figure 7:
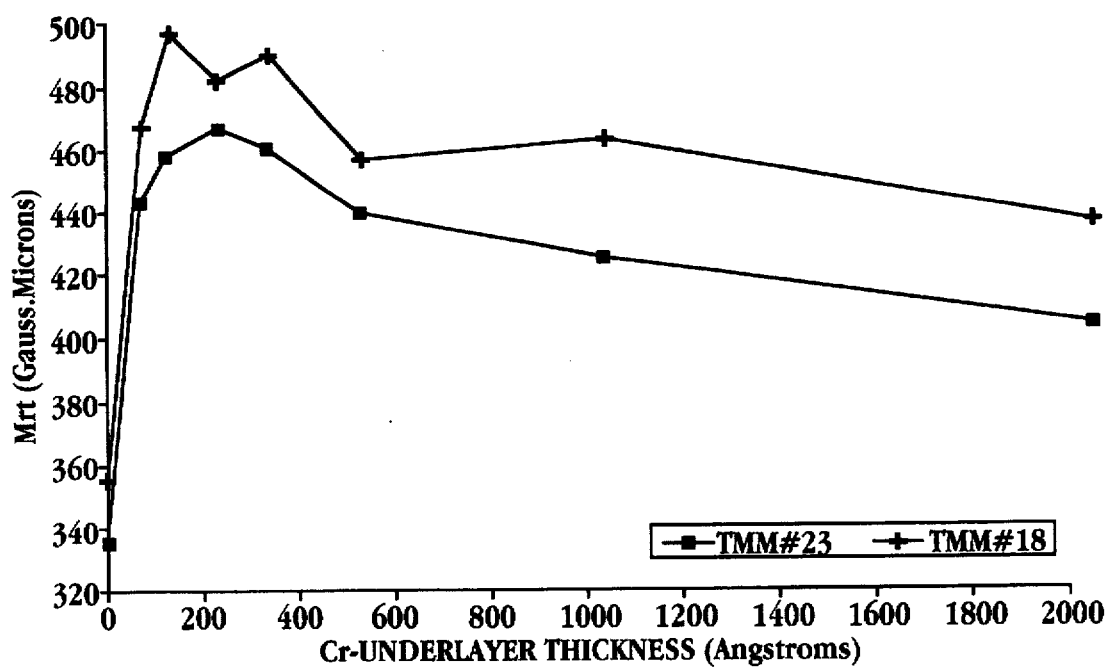
Figure 8:
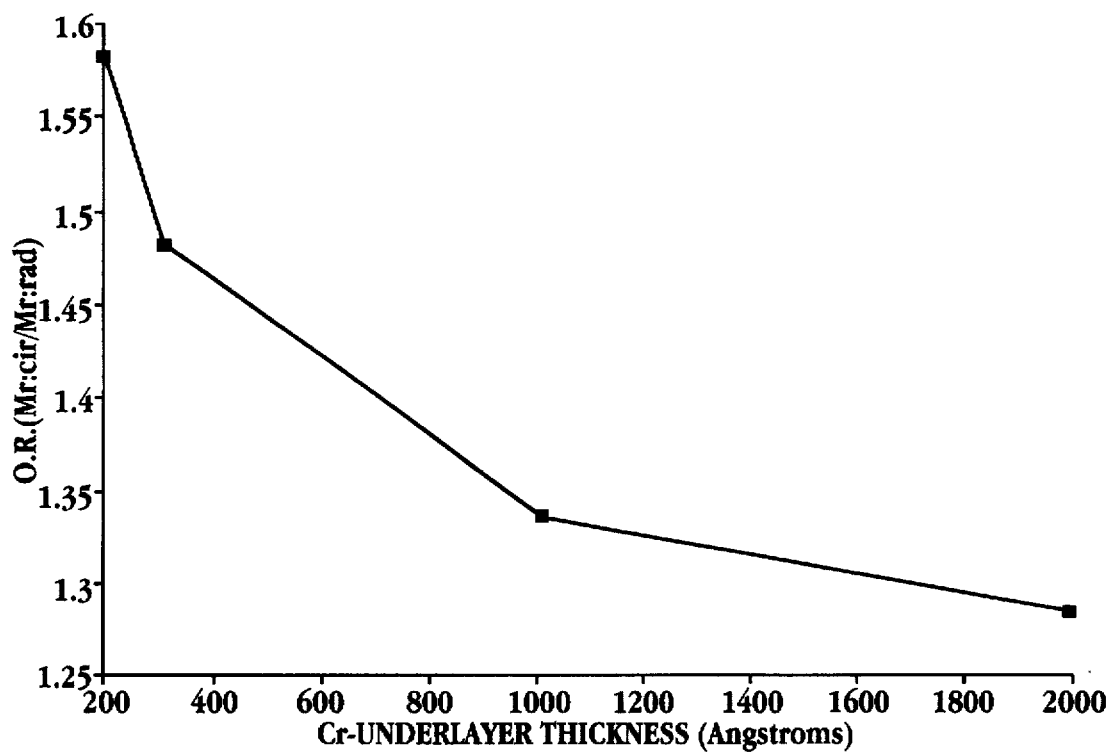
Figure 9:
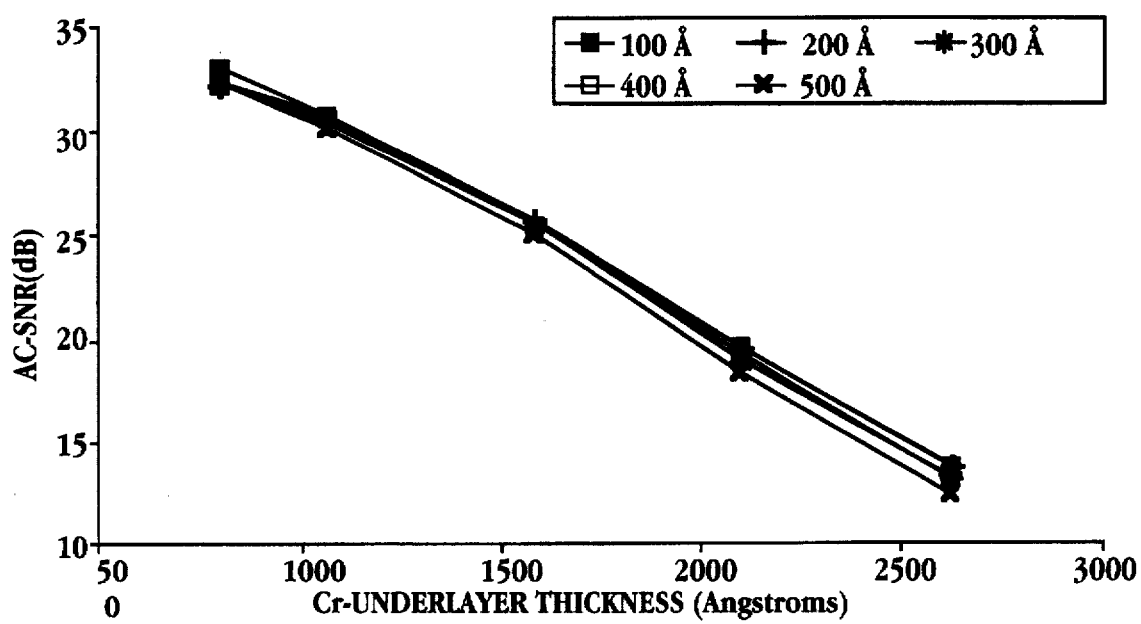

Figure shows the 4A and 4B M–H hysteresis loops of exemplary thin-film media formed in accordance with the present invention (4A) and the prior art (4B);

FIGS. 5A and 5B are plots of coercivity, as a function of Cr-underlayer thickness, in thin-film media produced by sputtering a 660 Å magnetic thin film at a substrate bias of −250 volts (solid rectangles, "+" symbols) or 0 volts ("*" symbols, open rectangles) for two different Co/Cr/Ta magnetic thin-film alloys, where FIG. 4B shows Cr thickness on an expanded scale;

FIG. 6 is a plot of loop squareness ratio ($M_r/M_s$) as a function of Cr-underlayer thickness, for two different Co/Cr/Ta magnetic thin-film alloys;

FIG. 7 is a plot of $M_r t$ as a function of Cr-underlayer thickness, for two different Co/Cr/Ta magnetic thin-film alloys;

FIG. 8 is a plot of orientation ratio ($M_r$ circumferential/$M_r$ radial) as a function of Cr-underlayer thickness, for a Co/Cr/Ta magnetic thin-film alloy; and FIG. 9 plots AC SNR, as a function of recording linear density, for thin-film media having Cr-underlayer thicknesses of 100 Å (solid rectangles), 200 Å ("+"), 300 Å ("*"), 400 Å (open rectangles), and 500 Å ("×").

DETAILED DESCRIPTION OF THE DRAWINGS

I. Thin-Film Medium

Figure 1:
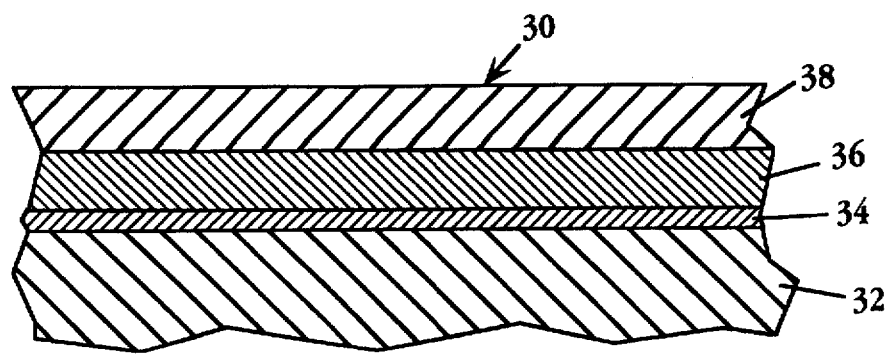
FIG. 1 is a sectional view of a thin-film medium formed in accordance with the invention.

FIG. 1 shows in cross section view, a fragmentary portion of a thin-film medium of disc 30 formed in accordance with the present invention. The disc generally includes a rigid substrate 32, and forming successive thin-film layers over the substrate, a crystalline underlayer 34, a magnetic thin-film layer 36, and a protective carbon overcoat 38.

The substrate may be a textured substrate, such as a conventional surface-coated, textured aluminum substrate of the type used commonly for digital recording medium, or a textured glass or ceramic substrate, such as described in co-owned patent application for "Glass Substrate with Controlled Low-Friction Surface", Ser. No. 475,715, filed Feb. 20, 1990.

According to an important aspect of the invention, the crystalline underlayer is a sputtered chromium underlayer having a thickness between about 100–300 Å, and preferably 150–250 Å. Magnetic recording properties of thin-film media, as a function of chromium underlayer thickness, are discussed in Sections II and III below. Chromium-containing alloys, such as CrV, CrGd and CrSi, may also be suitable.

The magnetic thin-layer film is formed by sputtering onto the underlayer, an target alloy composed of a Co-based alloy such as a Co/Cr or Co/Ni binary alloy, or a Co/Cr or Co/Ni based alloy, i.e., an alloy in which the binary elements are constitute about 80 atomic percent or more of the alloy. Exemplary alloys include Co/Cr/Ta, Co/Ni/Ta or Co/Ni/Cr ternary alloy, or a Co/Cr/Ta/B or Co/Ni/Ta/B quaternary alloy. Although the magnetic film alloy may contain Pt, one feature of the present invention is the ability to achieve high coercivity without addition of Pt to the magnetic alloy. One preferred magnetic thin film alloy is composed of 80–90 percent Co, 5–15 atom percent Cr, and 2–10 atom percent Ta. The elemental compositions of three exemplary magnetic thin-film alloys, identified herein as TM #18 and TMM #23 are given in Table 1 below. The magnetic-film layer is sputtered to a final thickness of between about 250–800 Å, and preferably to a final thickness of 400–800 Å.

TABLE 1

| Magnetic Alloy Compositions | Atomic Weight % | |
|---|---|---|
| | TMM #18 | TMM #23 |
| Cobalt | 86.3 | 85.5 |
| Chromium | 11 | 11.5 |
| Tantalum | 2.7 | 3 |

The carbon overcoat in the thin-film medium is preferably a carbon layer formed by sputtering carbon onto the magnetic layer, under conditions in which the carbon is in a predominantly diamond-like structure. The overcoat thickness is preferably between about 250 and 400 Å.

As will be seen below, the medium is characterized by high coercivity, i.e., at least 1,200 Oersteds (Oe), and preferably greater than 1,400 Oe, a loop squareness ratio greater than 0.75, and preferably greater than 0.8, a high orientation ratio, a high SNR, and dynamic recording properties consistent with high-density recording.

II. Method of Producing the Medium

Figure 2:
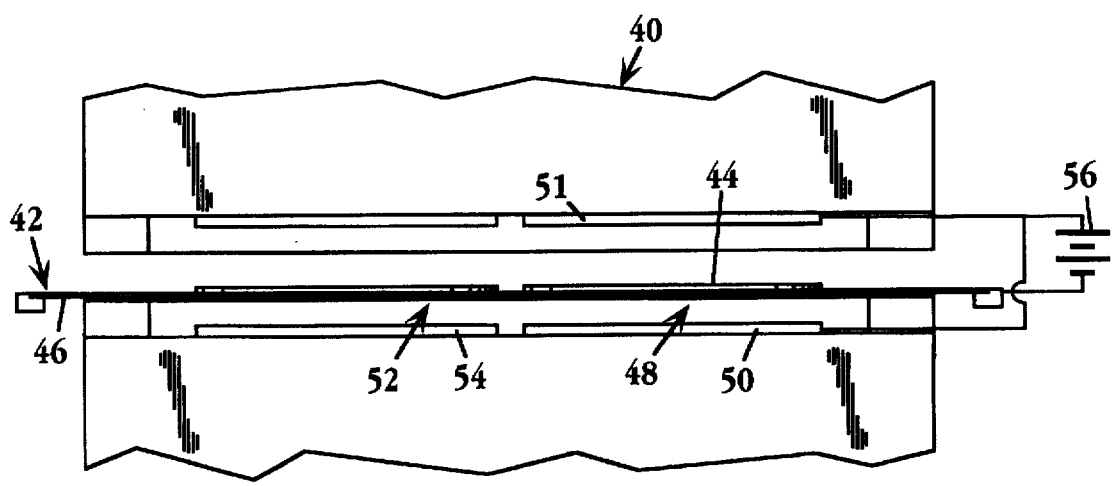
FIG. 2 is a schematic illustration of a portion of a sputtering apparatus used in forming the disc of the invention.

FIG. 2 shows, in schematic view, a portion of a sputtering apparatus 40 which is used, in the method of the invention, for producing the thin-film medium described in Section 1. The apparatus includes a vacuum chamber 42 having at least four stations at which sputtering or heating operations occur. A heating station (not shown) at the upstream end of the chamber has a plurality of infrared lights which are arrayed for heating both sides of a substrate, such as substrate 44, carried through the station in the chamber on an aluminum disc holder 46.

Just downstream of the heating station is a first sputtering station 48 at which the crystalline underlayer is formed on a substrate, in a manner to be described. The station includes a pair of targets, such as targets 50, 51, effective to sputter chromium onto opposite sides of a substrate, such as substrate 44. The targets in station 48 are preferably pure chromium targets, or chromium alloys containing predominantly chromium.

A second sputtering station (not shown) downstream of chamber 48 is designed for sputtering a magnetic film onto the underlayer. The station includes a pair of sputtering targets for sputtering the magnetic film alloy onto the substrate, after formation of the underlayer on the substrate. As indicated above, the targets in this station are formed of a Co/Cr- or Co/Ni-based alloy, and preferably one containing 80–90 percent Co, 5–20 atom percent Cr, and 2–10 atom percent Ta. The alloy is formed and shaped for use as a sputtering target by conventional metallurgical methods.

Also included in the apparatus is a DC power source 56 for placing a selected voltage potential between the sputtering targets, such as targets 50, 51 and the substrate, such as substrate 44 between the targets. More specifically, the power source is designed to place a DC negative bias on the substrate of −50 to −600 volts with respect to the confronting target voltage in both chamber 48, where Cr underlayer sputtering occurs, and the downstream chamber where magnetic thin-film layer sputtering occurs.

The carbon overcoat in the medium is produced by sputtering from a graphite target in a final sputtering station (not shown) in the apparatus. The basic sputtering apparatus is preferably a commercial system, such as is available from Varian (Santa Clara, Calif.), Circuits Processing Apparatus (Fremont, Calif.), ULVAC (Japan), Leybald Heraeus (Germany), VACTEC (Boulder, Colo.), or Materials Research Corporation (Albany, N.Y.). These systems are double-sided, in-line, high-throughput machines having two interlocking systems, for loading and unloading.

In operation, the sputtering chamber is evacuated to pressure of about $10^{-7}$ torr, and argon gas is introduced into the chamber to a final sputtering pressure of 5–20 mTorr. A preferred argon gas pressure is 6 mTorr.

Figure 3:
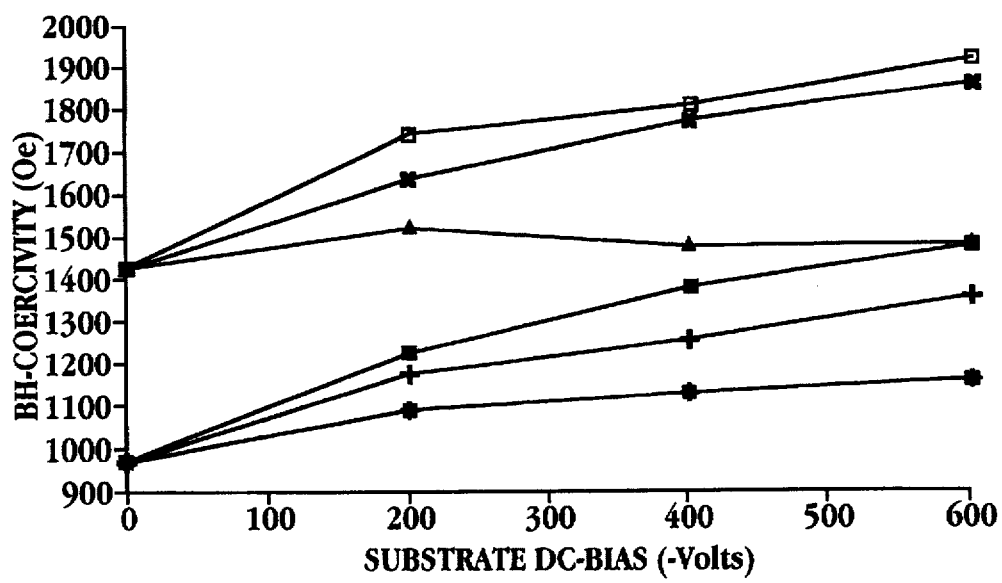
FIG. 3 shows the effect of substrate bias applied during sputtering of a chromium underlayer and/or a magnetic thin film layer in media formed in accordance with the present invention.

The substrate is heated in the heating station to a selected temperature before advancing into the two sputtering chambers. The heating conditions in the apparatus are preferably adjusted to achieve a substrate temperature of between about 220° C. and 270° C., and preferably about 250° C. The heated substrate is moved into the first sputtering chamber, and the chromium underlayer is sputtered onto the textured disc surface. According to one finding of the invention, the sputtering is preferably carried out at a substrate voltage potential, measured with respect to target, of −50 to −600 volts. FIG. 3 shows plots of coercivity as a function of substrate DC bias, for media formed with a 300 Å Cr underlayer and a 660 Å magnetic thin-film layer composed of the above TMM #23 alloy or a Co/Ni/Cr/V (71:20:7:2 atomic percent) alloy (identified as TMM #62). The three plots in the top of the figure designate media formed by substrate bias during sputtering of the Cr underlayer (solid triangles), magnetic thin-film layer ("×" symbols), and both underlayer and magnetic thin-film layer (open rectangles). As seen, substrate biasing during both sputtering steps produces maximum enhancement of coercivity, and is dependent on substrate negative voltage. Similar results were observed for the TMM #62 media, where the "*" symbols indicate underlayer sputtering bias, the "+" symbols, magnetic thin-film layer sputtering bias, and the solid rectangles, combined sputtering bias.

As indicated above, the Cr underlayer is deposited to a thickness of between about 100–300 Å, and preferably between about 150–250 Å. The sputtering rate from the Cr target is preferably adjusted to achieve a deposition rate of about 40 Å/sec.

FIGS. 4–9 are plots of magnetic disc properties shown as a function of chromium underlayer thickness, typically measured at underlayer thicknesses of 50 Å to 2,000 Å, and at a magnetic film thickness of 600 Å. Bulk magnetic properties were determined by vibrating sample magnetometry. Magnetic recording testing was carried out on a Guzik Model RWA 221, using a thin-film inductive reading and recording head with a gap length of 14 μin., a gap width of 472 μin., and a flying height of 4.5 μin. The head inductance was 1.1 μHenry and resistance, 30 ohms. Recording current was 25–30 mAmps for saturation.

FIGS. 4A and 4B show M-H hysteresis loops for media having a 660 Å Co/Cr/Ta magnetic thin-film (TMM#23) and a Cr underlayer having a thickness of 300 Å (4A) or 900 Å (4B). The media were formed with a −250 volt substrate bias during magnetic-layer sputtering. Similar VSM measurements were carried out media formed under identical conditions, but with the TMM #18 alloy magnetic thin film layer. The coercivity (in Oe), squareness ratio (SR), coercive squareness S*, Mrt, and orientation ratio (OR) were measured from the VSM curves conventionally, with the results shown in Table 2.

TABLE 2

| Magnetic Properties | VSM Data | | | |
|---|---|---|---|---|
| | Cr: 300 Å, MAG: 705 Å | | Cr: 900 Å, MAG 736 Å | |
| | TMM #23 | TMM #18 | TMM #23 | TMM #18 |
| Coercivitiy (Oe) | 1399 | 1373 | 1393 | 1358 |
| SR | 0.83 | 0.84 | 0.81 | 0.82 |
| S* | 0.76 | 0.81 | 0.82 | 0.84 |
| Mrt (G. μm) | 464 | 493 | 465 | 475 |
| O.R. (MrCIR/MrRAD) | 1.46 | 1.5 | 1.28 | 1.25 |

The thinner Cr underlayer gives comparable coercivity, improved squareness ratio, and significantly enhanced orientation ratio over a conventional medium with 900 Å Cr underlayer.

FIGS. 5A and 5B shows the effect of increasing Cr underlayer thickness on coercivity in media formed in the presence (solid rectangles, "+" symbols) and absence ("*" symbols and open rectangles) of a −250 volt substrate bias during magnetic-layer sputtering, where the magnetic thin film target was TMM #18 (solid rectangles, "*" symbols), or TMM #23 ("+" symbols and open rectangles), and the magnetic layer is 600 Å. With reference particularly to FIG. 5B, coercivity reached maximal or near-maximal levels in the 100–300 Å thickness range.

FIG. 6 is a plot of loop squareness ratio (SR) as a function of Cr underlayer thickness, shown for media prepared as above with a TMM #18 ("+" symbols) or TMM #23 (solid rectangles). For both media, highest squareness ratios are achieved at a 200–300 Å Cr underlayer thickness.

Peak M,t was observed in the 100–300 Å range for Cr underlayer thickness (FIG. 7), for media prepared as above. As seen, M,t peaked in the Cr-underlayer range of about 100–300 Å.

The orientation ratio, i.e., the ratio of magnetic remanence measured in the circumferential and radial directions ($M_{r\text{-}cir}/M_{r\text{-}rad}$) as a function of Cr-underlayer thickness is shown in FIG. 8 for the same magnetic medium (TMM #23 magnetic film, 600 Å). Highest orientation ratios were achieved at the lowest Cr underlayer thickness (200 Å). The orientation ratio decreased significantly (about 20 percent) over the range 200 to 2,000 Å Cr-underlayer thickness.

The AC-SNR measured at linear densities between 750 and 2600 flux change/mm is shown in FIG. 9 for media formed with Cr underlayer thicknesses of 100, 200, 300, 400, and 500 Å. Virtually no difference in SNR characteristics were observed over the 100–500 Å range of Cr-underlayer thickness.

In accordance with the findings presented above, the sputtering conditions in forming the medium are selected to produce a final underlayer thickness between about 100–300 Å, and preferably between about 150–250 Å. The underlayer thickness is controlled by conventional sputter deposition parameters, such as sputter pressure, target power, voltage, deposition time, etc, as indicated above. These parameters are adjusted, conventionally, to achieve the desired underlayer thickness. During sputtering of the underlayer, the substrate is preferably maintained at a negative bias of −50 to −600 volts, as discussed above.

After formation of the underlayer, the substrate is moved downstream on a disc holder into the second sputtering chamber, where the magnetic layer is sputtered onto the underlayer. The magnetic thin film is sputtered onto the underlayer under known conditions, such as described in the co-owned U.S. Pat. No. 4,816,127. The pressure and substrate temperature conditions are similar to those described above. The thickness of the magnetic layer is preferably between about 200–800 Å, and more preferably 400–800 Å.

After formation of the magnetic thin film, the substrate is carried on the disc holder toward a third sputtering station (not shown) at which a carbon overcoat is applied according to conventional sputtering methods.

III. Properties of the Medium

The recording characteristics of thin-film media formed with Cr underlayer thicknesses of 200 and 300 Å, in accordance with the present invention, and 1,000 and 2,000 Å, in accordance with the prior art, are compared in Tables 3 and 4 below, for magnetic film alloys TMM #18 and #23. The ID measurements (Table 3) were made at 0.950 inches, at a recording frequency of 5.44 MHz, and the outer diameter measurements (Table 4) at 1.659 inches at 8.5 MHz.

TABLE 3

| | | ID: R = 0.950 inch (HF: 5.44 MHz) | | | | | |
|---|---|---|---|---|---|---|---|
| BH Hc (Oe) | Cr-THICK (Å) | HF (uV) | RES. (%) | OW (−dB) | PW 50 (ns) | BS (ns) | SNR (dB) |
| | | TMM #23 MAGNETIC MEDIA | | | | | |
| 1587 | 2000 | 320 | 101.5 | 31.8 | 89.2 | 9.9 | 30.7 |
| 1562 | 1000 | 330 | 101 | 31.5 | 89.6 | 10.4 | 30.9 |
| 1603 | 300 | 340 | 102.2 | 30.2 | 89.3 | 9.2 | 30.9 |
| 1570 | 200 | 340 | 100.5 | 30.2 | 90.8 | 10.8 | 30.6 |
| | | TMM #18 MAGNETIC MEDIA | | | | | |
| 1591 | 2000 | 330 | 101.9 | 31.1 | 90 | 10.6 | 30.7 |
| 1581 | 1000 | 340 | 100.1 | 31 | 90.2 | 9.4 | 30.6 |
| 1587 | 300 | 340 | 99.7 | 28.9 | 91.6 | 11.8 | 30.5 |
| 1583 | 200 | 350 | 100.1 | 29.5 | 91.8 | 13.4 | 30.5 |

TABLE 4

| | OD: R = 1.659 inch (HF: 8.5 MHz) | | | | | |
|---|---|---|---|---|---|---|
| Cr-THICK (Å) | HF (μV) | RES. (%) | OW (−dB) | PW 50 (ns) | BS (ns) | SNR (dB) |
| | TMM #23 MAGNETIC MEDIA | | | | | |
| 2000 | 420 | 79.6 | 16.3 | 62.9 | 9.5 | 28.4 |
| 1000 | 440 | 81.3 | 16.2 | 62.9 | 9.1 | 28.3 |
| 300 | 430 | 81.4 | 14.8 | 63.4 | 9.7 | 28.3 |
| 200 | 431 | 79.7 | 16.7 | 63.7 | 9.2 | 28.4 |
| | TMM #18 MAGNETIC MEDIA | | | | | |
| 2000 | 410 | 80.9 | 16.1 | 62.8 | 9.7 | 28.2 |
| 1000 | 430 | 80.5 | 15.9 | 62.4 | 9.8 | 28.1 |
| 300 | 430 | 78.5 | 14.8 | 65 | 9.8 | 28.1 |
| 200 | 430 | 78.2 | 14.9 | 64.8 | 9.7 | 28.1 |

As shown in Table 3, the media of the present invention have high coercivity values (1,500–1,600 Oe), comparable to prior art media formed with 1,000 or 2,000 Å Cr underlayers. At both the inner and outer diameter regions of the media, HF signal (HF), resolution (RES), overwrite (OW), signal pulse width ($PW_{50}$), bit shift (BS), and SNR characteristics of the media of the present invention are comparable to prior art media.

From the foregoing, it can be appreciated how various objects and features of the invention are met. The media of the present invention can be made at lower cost, both in terms of sputter run time and target material, by virtue of the severalfold reduction in Cr underlayer thickness. At the same time, the media can be formed under conditions which give high coercivity, high $M_r$, and high orientation ratio, and dynamic recording parameters which are comparable to those of prior art media with relatively thick (1,000–2,000 Å) Cr underlayers, and relatively costly Co/Pt alloys.

Heretofore, in forming a high density recording medium, there has been increasing emphasis on high-remanence magnetic-film alloys, such as Co/Cr or Co/Cr/Ta alloys containing Pt or Ni, typically in an amount between 2–20 atom percent. Such alloys can give high signal amplitude, by virtue of their high remanence properties, but also tend to give high noise levels, limiting the SNR of the medium. High noise is particularly limiting at the inner-diameter region of the disc.

In accordance with the present invention, it has been discovered that, by employing a thin Cr underlayer (100–300 Å), a thin-film medium with a low-noise characteristics, such as a Co/Cr/Ta alloy, can be prepared with high signal amplitude properties. The high signal amplitude is the result of the higher $M_r t$ and higher orientation ratio achievable at lower Cr-underlayer thickness. At the same time, the medium retains a high coercivity also necessary for high density recording.

Although the invention has been described with respect to particular embodiments, it will be apparent to those skilled in the art that various changes and modifications can be made without departing from the invention.

It is claimed:

1. A magnetic thin-film medium comprising
   a disc-like substrate,
   formed on the substrate surface, a sputtered Cr underlayer having a thickness between about 100–300 Å, and
   a sputtered magnetic thin-film layer formed from a Co alloy and having a thickness between 250–800 Å,
   said medium being characterized by
   (i) a coercivity greater than about 1200 Oe;

(ii) a loop squareness ratio of greater than about 0.75; and (iii) an $M_rt$ value that is substantially greater than that obtained at a Cr underlayer thickness greater than about 500 Å.

2. The medium of claim 1, wherein the thin-film layer is formed of a Co/Cr/Ta alloy composition and has a thickness between 400–700 Å.

3. The medium of claim 2, wherein the alloy composition includes 80–90 atom percent Co, 5–15 atom percent Cr, and 2–10 atom percent Ta.

4. The medium of claim 1, wherein the Cr underlayer has a thickness of between about 150–250 Å.

* * * * *